United States Patent

Katsuno et al.

[11] Patent Number: 6,051,915
[45] Date of Patent: Apr. 18, 2000

[54] PIEZOELECTRIC TRANSFORMER

[75] Inventors: Masafumi Katsuno, Sendai; Yoshiaki Fuda, Natori, both of Japan

[73] Assignee: Tokin Corporation, Miyagi, Japan

[21] Appl. No.: 08/958,207

[22] PCT Filed: Feb. 10, 1997

[86] PCT No.: PCT/JP97/00335

§ 371 Date: Oct. 3, 1997

§ 102(e) Date: Oct. 3, 1997

[87] PCT Pub. No.: WO97/29521

PCT Pub. Date: Aug. 14, 1997

[30] Foreign Application Priority Data

Feb. 8, 1996 [JP] Japan ................................. 8-022302
Feb. 27, 1996 [JP] Japan ................................. 8-039268
Oct. 9, 1996 [JP] Japan ................................. 8-268351
Nov. 22, 1996 [JP] Japan ................................. 8-312098

[51] Int. Cl.[7] ............................................. H01L 41/107
[52] U.S. Cl. ..................................... 310/359; 310/366
[58] Field of Search ................................. 310/357, 359, 310/365, 366

[56] References Cited

U.S. PATENT DOCUMENTS

| | | | |
|---|---|---|---|
| 3,549,913 | 12/1970 | Moriki et al. ........................... | 310/359 |
| 3,598,909 | 8/1971 | Saski et al. ............................. | 310/359 |
| 5,278,471 | 1/1994 | Uehara et al. .......................... | 310/328 |
| 5,365,141 | 11/1994 | Kawai et al. ........................... | 310/359 |
| 5,371,430 | 12/1994 | Sato et al. .............................. | 310/359 |
| 5,463,266 | 10/1995 | Fukuoka et al. ....................... | 310/359 |
| 5,504,384 | 4/1996 | Lee et al. ............................... | 310/359 |
| 5,701,049 | 12/1997 | Kanayama et al. .................... | 310/359 |
| 5,736,807 | 4/1998 | Hakamata et al. ..................... | 310/359 |
| 5,763,983 | 6/1998 | Huang ................................... | 310/360 |
| 5,811,913 | 9/1998 | Kawai .................................... | 310/359 |
| 5,818,150 | 10/1998 | Yamamoto et al. ................... | 310/359 |
| 5,872,419 | 2/1999 | Hall et al. .............................. | 310/359 |
| 5,903,086 | 5/1999 | Ogiso et al. ........................... | 310/359 |

FOREIGN PATENT DOCUMENTS

| | | | |
|---|---|---|---|
| 0555887 | 2/1993 | European Pat. Off. ........ | H01L 41/08 |
| 0 693 791 | 1/1996 | European Pat. Off. ...... | H01L 41/107 |
| 0 706 227 | 4/1996 | European Pat. Off. ...... | H01L 41/107 |
| 08008472 | 1/1996 | Japan ........................... | H01L 41/107 |

OTHER PUBLICATIONS

JP, 7–74405, A (Industrial Technology Research Institute), Mar. 17, 1995 (Family: None).

JP, 6–224484, A (NEC Corp.), Aug. 12, 1994 & US, 5440195, A.

JP, 8–107240, A (NEC Corp.), Apr. 23, 1996 & EP, 706227, A1.

JP, 5–21858, A (Tokin Corp.) Jan. 29, 1993 (29.01.93) (FAmily:None).

Primary Examiner—Thomas M. Dougherty
Attorney, Agent, or Firm—Hopgood, Calimafde, Kalil & Judlowe

[57] ABSTRACT

A piezoelectric transformer (21) comprises a piezoelectric rectangular body (23) having equally divided first to fourth regions (A1, A2, A3, and A4) in a longitudinal direction. The first and the fourth regions (A1, A4) are provided with plane electrodes (24, 25, 26, and 27) as input electrodes and polarized opposite to each other in a thickness direction. Strip-like electrodes (30, 31) are formed at the boundary between the two remaining regions (A2, A3) as output electrodes. An AC input voltage having a frequency corresponding to a wavelength equal to of the length of the piezoelectric body is applied to the input electrodes to vibrate the piezoelectric plate in a one-wavelength resonance mode. A voltage produced due to the piezoelectric effect in response to the vibration is extracted from the output electrode. The transformer is small in size, low in vibration rate and heat generation, and excellent in efficiency. As a modification, the input electrodes may be formed in two regions which are symmetric or opposite to each other in displacement distribution in the one-wavelength resonance without being restricted to the first and the fourth regions while the output electrode is provided in another region. As further modification, the first and the second regions are formed as an input portion as a separate body separate from the third and the fourth regions as an output portion. These portions are adhered to each other.

9 Claims, 6 Drawing Sheets

PIEZOELECTRIC TRANSFORMER

TECHNICAL FIELD

This invention relates to a piezoelectric transformer which utilizes a piezoelectric vibrator of a one-wavelength resonance type using a rectangular plate of piezoelectric ceramics.

BACKGROUND ART

As a transformer (voltage transformer), there is well known an electromagnetic transformer comprising windings wound around an iron core. The electromagnetic transformer is unsuitable for use in a power supply for a small-sized electric apparatus because it is bulky in size, is large in power consumption, and generates electromagnetic noise and heat. For example, for use in a high-voltage power supply in an electrostatic generating device or a backlighting lamp of a liquid-crystal display, the transformer does not require a large output current but requires an output voltage between 1 kV and about several watts. In addition, it is required to reduce the electromagnetic noise, the power consumption, and the size.

On the other hand, since a piezoelectric transformer utilizing a piezoelectric phenomenon generates little electromagnetic noise and can be reduced in size, practical use is considered as a power supply transformer for a small-sized apparatus.

Figure 1:
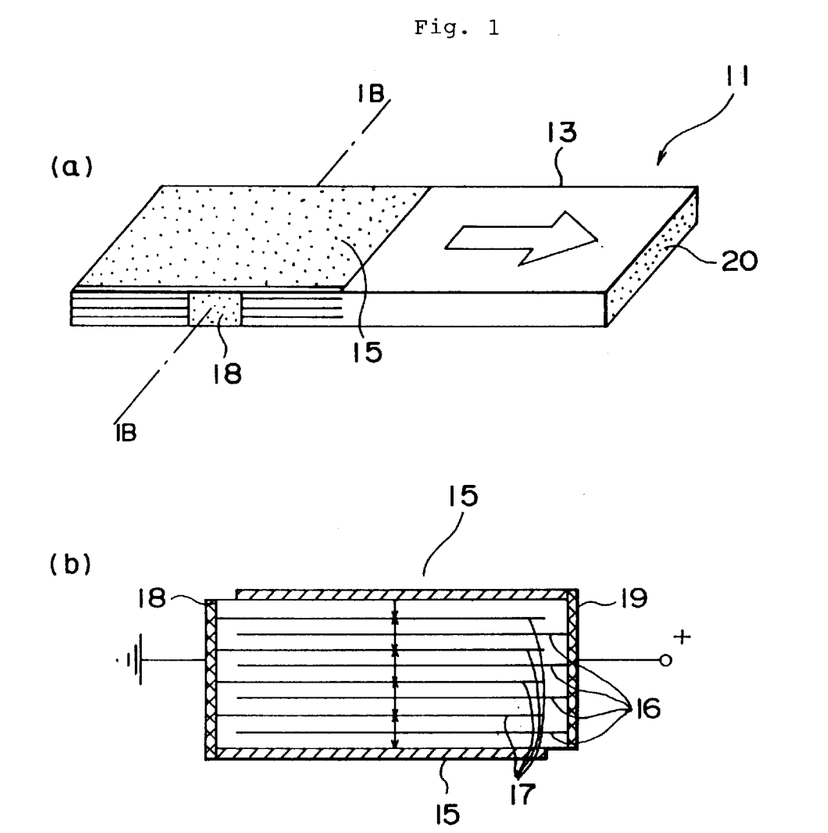
FIG. 1 shows views illustrating a conventional Lozen type piezoelectric transformer, (a) being a schematic perspective view, (b) being a sectional view taken along a line 1B—1B in (a).

Referring to FIGS. 1(a) and (b), a conventional piezoelectric transformer 11 comprises a piezoelectric-ceramics rectangular plate 13, two surface electrodes 15 and 15 formed on the piezoelectric-ceramics rectangular plate 13 opposite to each other in a thickness direction at a part (hereinafter referred to as a first part) extending from one end to an approximate half in a longitudinal direction, and a plurality of internal electrodes 16 and 17 formed in the interior of the above-mentioned first part between the both surface electrodes with a space kept from one another in the thickness direction. Side electrodes 18 and 19 formed on confronting side surfaces of the above-mentioned first part, respectively, are connected to the surface electrodes 15 and 15, respectively, and to the alternate internal electrodes 16 and the remaining internal electrodes 17, respectively. Moreover, an end electrode 20 for output extraction is formed on the piezoelectric-ceramics rectangular plate 13 over an end surface of a half part (hereinafter referred to as a second part) opposite to the above-mentioned first part.

The above-mentioned first part of the piezo-electric-ceramics rectangular plate 13 is polarized by applying a DC voltage between the side electrodes 18 and 19. Specifically, the piezoelectric-ceramics rectangular plate 13 is polarized between adjacent electrodes of the surface electrodes 15 and 15 and the internal electrodes 16 and 17. The polarization directions are opposite to each other at both sides of each of the internal electrodes 16 and 17, as depicted by small arrows in FIG. 2(b). Furthermore, by applying a DC voltage between the both surface electrodes 15 and the end electrode 20, the second part of the piezoelectric-ceramics rectangular plate 13 is polarized in the longitudinal direction, as depicted by a large arrow in FIG. 1(b).

The piezoelectric transformer of the one-wavelength resonance type having the above-mentioned electrode structure is referred to as a Lozen type piezoelectric transformer.

The above-mentioned type including the plurality of internal electrodes as input electrodes will be referred to as a stacked type because it is actually formed by alternately stacking the internal electrodes and piezoelectric members during manufacture. On the other hand, another type is also known in which the polarization in the thickness direction is only one direction between the confronting surface electrodes 15 and 15 without any internal electrodes formed. This type will be referred to as a single plate type because no stacking is required during manufacture and it is implemented by a single piezoelectric member with electrodes formed on its surface.

Description will now be made as regards an operation of the Lozen type piezoelectric transformer illustrated in FIGS. 1(a) and (b).

Figure 2:
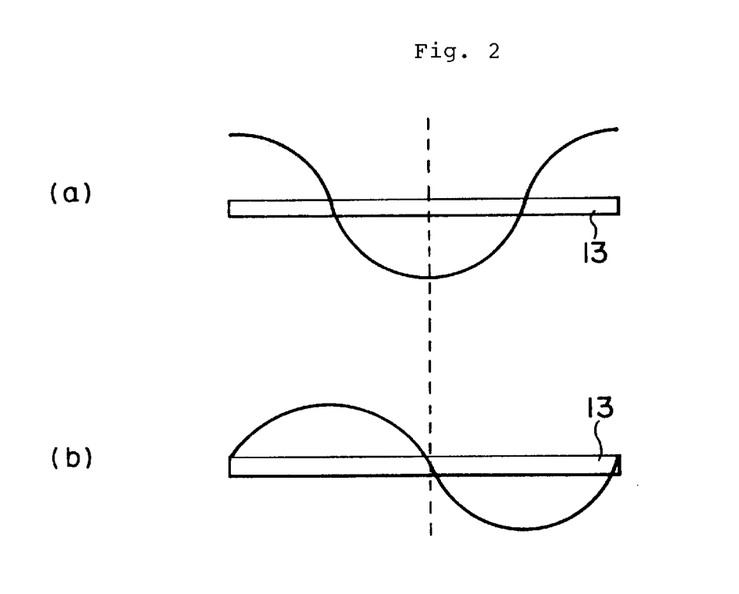

Now, one of the side electrodes 18 and 19 is used as a ground terminal and the other is applied as an input voltage with an AC voltage having a frequency equal to a resonant frequency of the piezoelectric-ceramics rectangular plate 13 in a one-wavelength resonance mode of a longitudinal vibration. Then, the stacked-type piezoelectric transformer acts as a piezoelectric vibrator to vibrate with a displacement distribution and a strain distribution illustrated in FIGS. 2(a) and (b), respectively. At this time, an AC voltage is produced between each of the surface and the internal electrodes 15, 16 and 17 and the end electrode 20 due to the piezoelectric effect. The level of the voltage thus produced is generally determined by distances between the surface electrodes 15 and the internal electrodes 16 and 17, a distance between the surface electrodes 15 and the end electrode 20, and the input voltage. Specifically, in the piezoelectric transformer, a transformed voltage can be obtained by energy conversion utilizing the piezoelectric effect, that is, electric-mechanical-electric conversion.

In the meanwhile, with the recent demands for reduction in size and weight of electronic apparatuses, the piezoelectric transformer of this type is also required to be small in size and weight. For example, as for the piezoelectric vibrator having the dimension of the length (mm)×the width (mm)×the thickness (mm) 42×12×1.5, it is required that the width is reduced to half (42×6×1.5) to decrease its volume to half.

However, when the volume of the piezoelectric vibrator is reduced, transmitted electric power is decreased in proportion to the reduction in volume. In order to obtain a predetermined output, the vibration rate of the piezoelectric vibrator must be increased. Specifically, once the vibration mode and the length of the piezoelectric vibrator are determined, the vibration frequency is also determined. In order to increase the vibration rate in case where the width of piezoelectric vibrator is reduced to half as described above, an input voltage must be increased to increase the displacement (amplitude) of the piezoelectric vibrator.

However, the increase of the vibration rate in the piezoelectric vibrator brings about the increase of heat generation to result in the decrease in efficiency. Specifically, in case where a desired output can not be obtained at the vibration rate as high as a vibration level limit (this means the vibration rate at which the temperature ($\Delta T$) of the vibrator reaches a predetermined level due to heat generation at a high vibration rate and a large amplitude; the predetermined level can be selected, for example, as $\Delta T=25°$ C.) inherent to the piezoelectric ceramics, the heat generation exponentially increases and the efficiency is considerably decreased even if the vibration rate is increased over the vibration level limit. Accordingly, the desired output can not be obtained. Thus, in the conventional piezoelectric transformer having the Lozen type electrode structure, it is difficult to reduce the size.

It is an object of this invention to provide a piezoelectric transformer which is smaller in size than the conventional piezoelectric transformer but is still capable of obtaining an output equivalent to that of the conventional piezoelectric transformer at a vibration rate lower than a vibration level limit inherent to a material.

DISCLOSURE OF THE INVENTION

According to an aspect of this invention, there is provided a piezoelectric transformer utilizing vibration in a one-wavelength resonance mode in a longitudinal direction of a piezoelectric rectangular plate, comprising: the piezoelectric rectangular plate having a plate length extending from a first end to a second end opposite thereto, a plate width, and a plate thickness, and having virtually divided quarter regions as first to fourth regions arranged along the plate length from the first end to the second end in this order; input electrode means comprising at least two plane electrodes formed in each of the first and the fourth regions adjacent to the first and the second ends of the piezoelectric plate, respectively, for being applied with an AC input voltage having a frequency corresponding to a wavelength equal to the plate length to drive one-wavelength resonance of the piezoelectric plate; and output electrode means comprising a strip-like electrode formed at the boundary between the second and the third regions of the piezoelectric plate to extend in the width direction for outputting an AC output voltage produced from the one-wavelength resonance of the piezoelectric plate; the first and the fourth regions being polarized opposite to each other in a direction of the plate thickness while the second and the third regions being polarized in a direction of the plate length, respectively.

According to another aspect of this invention, there is also provided a piezoelectric transformer utilizing vibration in a one-wavelength resonance mode in a longitudinal direction of a piezoelectric rectangular plate, comprising: the piezoelectric rectangular plate having a plate length extending from a first end to a second end opposite thereto, a plate width, and a plate thickness, and having virtually divided quarter regions as first to fourth regions arranged along the plate length from the first end to the second end in this order; input electrode means comprising at least two plane electrodes formed in each of the second and the third regions at the center of the piezoelectric plate for being applied with an AC input voltage having a frequency corresponding to a wavelength equal to the plate length to drive one-wavelength resonance of the piezoelectric plate; and output electrode means comprising plane electrodes formed on end surfaces at the first and the second ends of the piezoelectric plate for outputting an AC output voltage produced from the one-wavelength resonance of the piezoelectric plate; the second and the third regions being polarized opposite to each other in a direction of the plate thickness while the first and the fourth regions being polarized in a direction of the plate length.

According to another aspect of this invention, there is also provided a piezoelectric transformer utilizing vibration in a one-wavelength resonance mode in a longitudinal direction of a piezoelectric rectangular plate, comprising: the piezoelectric rectangular plate having a plate length extending from a first end to a second end opposite thereto, a plate width, and a plate thickness, and having virtually divided quarter regions as first to fourth regions arranged along the plate length from the first end to the second end in this order; input electrode means comprising at least two plane electrodes formed over the first and the second regions of the piezoelectric plate and which is applied with an AC input voltage having a frequency corresponding to a wavelength equal to the plate length to drive one-wavelength resonance of the piezoelectric plate; and output electrode means comprising a strip-like electrode formed at the boundary between the third and the fourth regions of the piezoelectric plate to extend in the width direction and a grounding electrode formed on an end surface at the second end for outputting an AC output voltage produced from the one-wavelength resonance of the piezoelectric plate; the first and the second regions being polarized unidirectionally in a direction of the plate thickness while the third and the fourth regions being polarized opposite to each other in a direction of the plate length.

According to another aspect of this invention, there is also provided a piezoelectric transformer wherein a section including the first and the second regions of the piezoelectric plate which are provided with the input electrode means and another section including the third and the fourth regions of the piezoelectric plate provided with the output means are formed by separate components as an input portion and an output portion, respectively, the input and the output portions being bonded and adhered to each other.

Specifically, according to this invention, the input electrodes are formed, among the first to the fourth regions of the piezoelectric plate, in two regions in which the displacements of the piezoelectric plate by the one-wavelength resonance vibration are symmetric or opposite to each other while the output electrode is provided in another region. Therefore, although the piezoelectric transformer utilizes the one-wavelength resonance mode, the piezoelectric transformer is low in vibration rate and in heat generation, small in size, and excellent in efficiency as compared with the conventional Lozen type piezoelectric vibrator.

BRIEF DESCRIPTION OF THE DRAWING

FIGS. 2(a) and (b) show displacement distribution and strain distribution of a piezoelectric-ceramics plate, respectively, when the piezoelectric transformer in FIG. 1 is driven.

BEST MODE FOR CARRYING OUT THE INVENTION

Description will be made as regards a piezoelectric transformer according to one embodiment of this invention with reference to the drawing.

Referring to FIG. 3(a), a piezoelectric transformer 21 comprises a rectangular plate 23 of piezoelectric ceramics (for example, PZT=lead-zirconate-titanate). Four regions (length of l/4) of the piezoelectric-ceramics rectangular plate 23 formed by division into quarters in a longitudinal direction along its length (l) are assumed to be first to fourth regions A1, A2, A3, and A4 from the lefthand in the figure, respectively. In the first and the fourth regions A1 and A4 at both longitudinal ends, input surface electrodes 24a, 25a, 24b, and 25b are formed on surfaces opposite in its thickness direction. Inside these regions, a plurality of internal electrodes 26a, 27a, 26b, and 27b are formed with spaces therebetween in the thickness direction. Each of the surface electrodes is a planar or flat electrode and extends in the longitudinal and the width directions of the rectangular plate 23 in each of the first and the fourth regions but is restricted in each region.

Furthermore, on the upper and the lower surfaces of the rectangular plate 23, strip-like surface electrodes 30a and 30b extending in its width direction are formed at a boundary between the second and the third regions A2 and A3 at the center area of the piezoelectric-ceramics rectangular plate 23.

The surface electrodes 24a, 25a, 24b, and 25b are used as input electrode means for applying an input voltage to drive the rectangular plate 23 in a one-wavelength resonance mode and are connected to input terminals 28a, 29a, 28b, and 29b in the vicinity of the boundaries between the every adjacent regions, respectively.

On the other hand, strip-like internal electrodes 26 and 27 are used as output electrode means for extracting an output voltage and are connected to the output electrode terminals 30a and 30b, respectively.

The input terminals 28a and 29b are connected in common while the input terminals 29a and 29b are connected in common, and a DC voltage is applied between the both common connections to thereby polarize the above-mentioned first and the fourth regions A1 and A4. As depicted by arrows in FIG. 3, the polarization directions are opposite to each other in the thickness direction.

The two input terminals 28a and 29a in the first region A1 are connected in common while the two output terminals 30a and 30b of the output electrodes 26 and 27 are connected in common, and the DC voltage is applied between the both common connections. Thus, the second region A2 is polarized rightward in the longitudinal direction (it is needless to say that the polarization can be done leftward), as depicted by a large arrow in FIG. 3(a). Similarly, the two input terminals 28b and 29b in the fourth region A4 are connected in common while the output terminals 30a and 30b are connected in common, and the DC voltage is applied between the both common connections. Thus, the third region A3 is polarized rightward in the longitudinal direction (it is needless to say that the polarization can be done leftward), as depicted by a large arrow in FIG. 3(a).

The two input terminals 28a and 28b at the both sides are connected in common on the upper surface, while the two input terminals 29a and 29b at the both sides are connected in common on the lower surface and the AC voltage is applied between both common connections. If its frequency is selected to be a frequency having a wavelength equal to the length (l) of the rectangular plate 23, the rectangular plate 23 vibrates to exhibit the displacement and the strain illustrated in FIG. 3(b). The boundary between the first and the second regions A1 and A2 and the boundary between the third and the fourth regions A3 and A4 correspond to vibration nodes.

Figure 3:
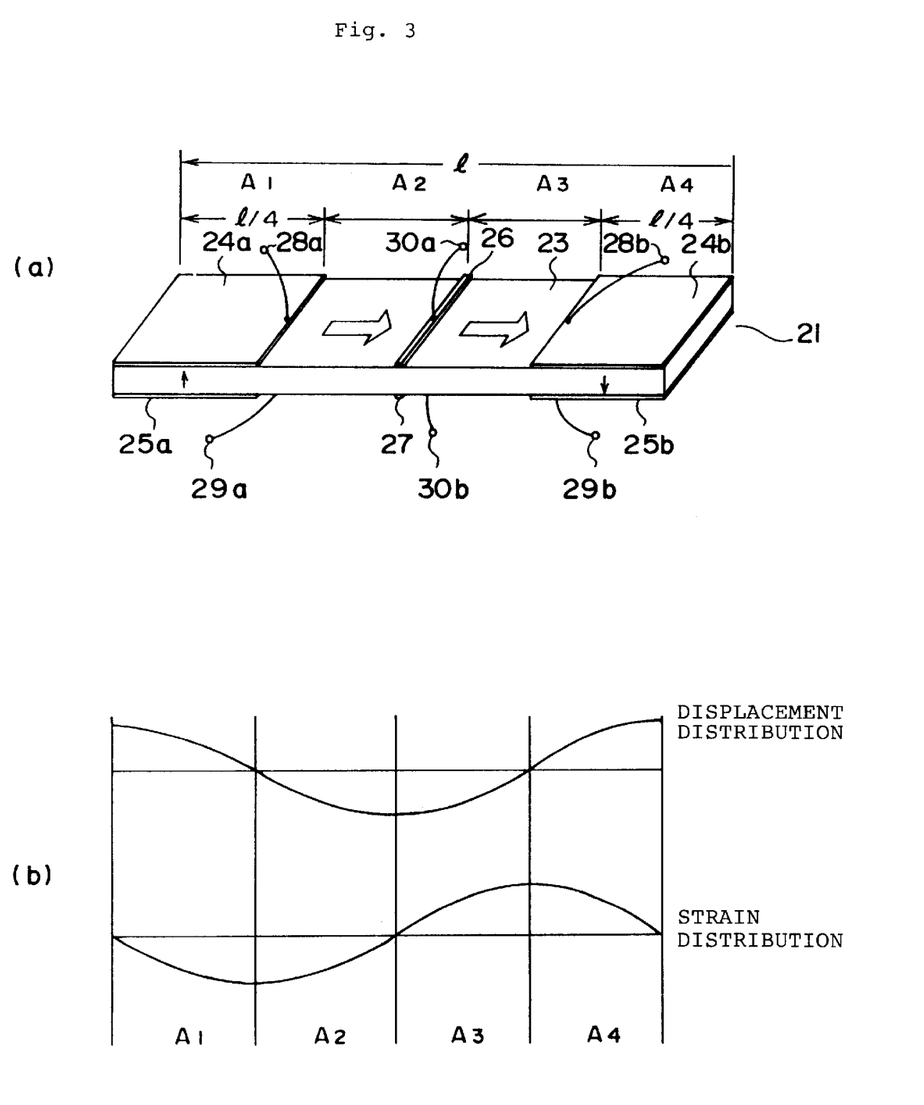
FIG. 3 shows views illustrating a piezoelectric transformer according to one embodiment of this invention, (a) being a schematic perspective view thereof, (b) showing a displacement distribution and a strain distribution of a piezoelectric-ceramics plate when the piezoelectric transformer in (a) is driven.

As a result of the vibration, an AC output voltage which is stepped up can be obtained between the output electrode 26 and 27 and the input electrode 28a, 28b, 29a, or 29b. Thus, the output voltage can be obtained as a voltage between the input terminal 28a or 29a and the output terminal 30a or 30b. Alternatively, the output voltage can be obtained as a voltage between the input terminal 28b or 29b and the output terminal 30a or 30b.

Next, the piezoelectric transformer having the above-mentioned structure was manufactured as follows.

First, piezoelectric-ceramics rectangular green sheets of high-Qm PZT containing $Mn_{1/3}Sb_{2/3}$ and having the dimension of 42×6×1.5 (mm) was baked in air at 1200° C. Thereafter, the input electrodes 28a to 29b and the output electrodes 26 and 27 were formed by printing silver paste at the above-mentioned predetermined positions. Subsequently, the above-mentioned polarization was carried out in silicon oil kept at 140° C. under the electric field strength of 1.0 kV/mm.

The piezoelectric transformer thus manufactured was driven with a load of a cold-cathode tube having a diameter of 2.6 mm and a length of 220 mm and subjected to an evalution test. Table 1 shows characteristics measured. As a comparative example, the conventional Lozen-type piezoelectric transformer was manufactured and subjected to the similar evalution test. The result is also shown in Table 1.

TABLE 1

|  | Lozen type | Embodiment |
| --- | --- | --- |
| input voltage (Vpp) | 95 | 110 |
| tube current (mA) | 5 | 5 |
| step-up ratio | 5 | 4.5 |
| vibration rate (m/s) | 0.38 | 0.2 |
| heat generation ΔT (° C.) | 65 | 15 |
| efficiency (%) | 80 | 84 |

As is apparent from Table 1, as compared with the conventional piezoelectric transformer (the Lozen type), the piezoelectric transformer (Embodiment) according to the embodiment of this invention has a low vibration rate and small heat generation when the same output (tube current) is obtained. Accordingly, the efficiency is also high.

In the piezoelectric transformer of this embodiment, the vibration level limit is generally on the order between 0.1 and 0.2 (m/s) although it is dependent on the shape of the electrode or the vibration plate. Since the large heat generation was not observed, the vibration rate is judged to be within the vibration level limit. In contrast, in the Lozen-type piezoelectric transformer of the comparative example, the vibration rate is almost twice that of the embodiment and the heat generation quantity is also large. Accordingly, the Lozen type of the comparative example already exceeds the vibration level limit, so that further reduction in size will be impossible.

In the piezoelectric transformer of this embodiment, the step-up ratio is slightly decreased, as compared with the Lozen-type piezoelectric transformer of the comparative example. However, the decrease of the step-up ratio is small. No particular problem will arise because the step-up ratio can be easily improved by the use of the input electrodes having the stacked structure (the structure comprising piezoelectric materials and electrode materials alternately stacked).

According to this embodiment, in the piezo-electric transformer driven in the one-wavelength vibration mode, the input electrodes are formed at the longitudinal end portions of the piezoelectric vibrator while the output electrodes are formed at the longitudinal center. With this structure, it is possible to provide a piezoelectric transformer which is small in size, low in vibration rate, small in heat generation, and high in efficiency.

In the above-mentioned embodiment, the input electrodes comprise only the surface electrodes formed on the upper and the lower surfaces of the rectangular plate 23. However, use may be made of a stacked type having the internal electrodes, as described in following embodiments. The input/output terminals may be formed as side electrodes.

Next referring to FIG. 4 and FIG. 5, description will be made as regards another embodiment of this invention.

Figure 4:
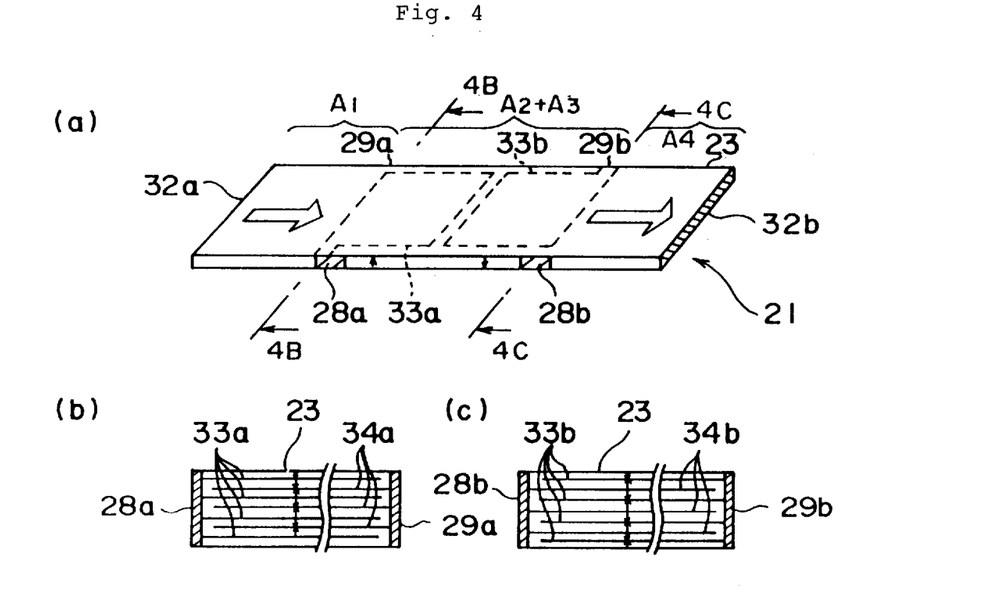
FIG. 4 shows views illustrating a piezoelectric transformer according to another embodiment of this invention, (a) being a schematic perspective view thereof, (b) and (c) being sectional views taken along a line 4B—4B and a line 4C—4C in (a), respectively.

Referring to FIGS. 4(*a*), (*b*), and (*c*), like the above-mentioned embodiment, a piezoelectric transformer of this embodiment also comprises the piezoelectric-ceramics rectangular plate 23 provided with the input electrode means and the output electrode means. Like the embodiment in FIG. 3, it is assumed that the piezoelectric-ceramics rectangular plate 23 has regions quartered in its longitudinal direction which are first to the fourth regions A1 to A4 ordered from the lefthand in FIG. 4(*a*). The piezoelectric transformer of this embodiment is basically different from the piezoelectric transformer of FIG. 3 in that the input electrode means are formed in the second and the third regions A2 and A3 (depicted as A2+A3), that internal electrodes 33*a* to 34*b* are formed instead of the surface electrodes 24*a* to 25*b*, that the side electrodes 28*a* to 29*b* are formed as the input terminals, that the output electrode means are formed as end electrodes 32*a* and 32*b* on both longitudinal end surfaces of the rectangular plate. More in detail, in this embodiment, as the input electrodes, the plurality of internal electrodes 33*a*, 34*a*, 33*b*, and 34*b* are formed in the second and the third regions A2 and A3 at a longitudinal center area of the rectangular plate 23 with a space left in the thickness direction. These internal electrodes are planar electrodes and extend in the longitudinal and the width directions of the rectangular plate 23 in each of the second and the third regions A1 and A2 but are restricted in each region. Furthermore, the side electrodes 28*a*, 29*a*, 28*b*, and 29*b* are formed on side surfaces opposite to each other in the width direction.

As illustrated in FIG. 4(*b*), in the second region A2, the internal electrodes 33*a* and 34*a* are formed in such a manner that the alternate internal electrodes 33*a* are connected to the side electrodes 28*a*, and the other alternate internal electrodes 34*a* are connected to the side electrodes 29*a*. On the other hand, as illustrated in FIG. (c), in the third region A3, the internal electrodes 33*b* and 34*b* are formed in such a manner that the alternate internal electrodes 33*b* are connected to the side electrodes 29*b* and the other alternate internal electrodes 34*b* are connected to the side electrodes 28*b*.

The internal electrodes and the side electrodes are used as input electrode means for applying an input voltage to drive the rectangular plate 23 in the one-wavelength resonance mode.

Polarization is carried out in the manner similar to the embodiment of FIG. 3. Specifically, the side electrodes 28*a* and 28*b* in the second and the third regions A2 and A3 are connected in common while the side electrodes 29*a* and 29*b* are connected in common, and a DC voltage is applied between the both common connections to thereby polarize the above-mentioned second and the third regions A2 and A3. As depicted by arrows in FIGS. 4(*b*) and (*c*), the polarization directions are opposite to each other at both sides of each internal electrode in the thickness direction. The polarization directions in the second region A2 in FIG. 4(*b*) are opposite to the polarization directions in the third region A3 in FIG. 4(*c*), respectively.

The side electrodes 28*a* and 29*a* in the second region A2 are connected in common, and the DC voltage applied between the common connection and the end electrode 32*a*. Thus, the first region A1 is polarized rightward in the longitudinal direction (it is needless to say that the polarization can be done leftward), as depicted by a large arrow in FIG. 4 (*a*). Similarly, the side surface electrodes 28*b* and 29*b* in the third region A3 are connected in common with the DC voltage applied between them and the end electrode 32*b*. Thus, the fourth region A4 is polarized rightward in the longitudinal direction (it is needless to say that the polarization can be done leftward), as depicted by a large arrow in FIG. 4 (*a*).

The two side electrodes 28*a* and 28*b* at one side of the second and the third regions A2 and A3 are connected in common, while the other two side electrodes 29*a* and 29*b* at the opposite side are connected in common with the AC voltage applied between both common connections. If its frequency is selected to be a frequency having a wavelength equal to the length (l) of the rectangular plate 23, the rectangular plate 23 vibrates with the displacement and the strain similar to those illustrated in FIG. 3(*b*). As a result of the vibration, an AC output voltage which is stepped up can be obtained between the end electrodes 32*a* and 32*b*.

Next referring to FIG. 5, description will be made in detail as regards a method of manufacturing the piezoelectric transformer.

Figure 5:
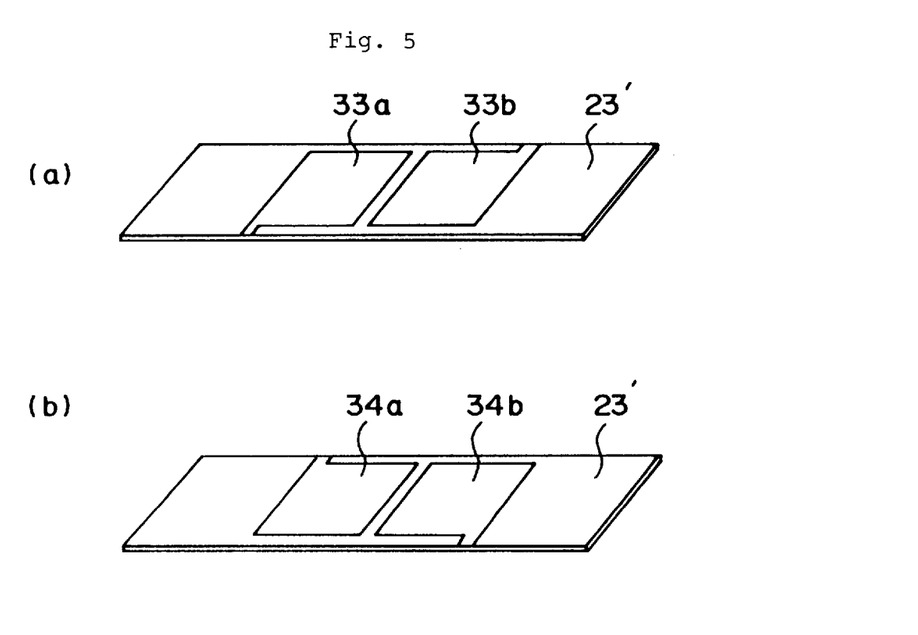
FIG. 5 are perspective views (a) and (b) of two kinds of green sheets with electrodes alternately stacked in the manufacturing process of the stacked-type piezoelectric transformer in FIG. 4.

First, as illustrated in FIG. 5(*a*), at predetermined positions on a piezoelectric-ceramics green sheet of high Qm PZT having a predetermined shape, the internal electrodes 26*a* and 26*b* and the strip-like internal electrode 31 are printed as internal electrode patterns by the use of silver-palladium electrode paste. A plurality of similar green sheets with the same electrode patterns are prepared. On the other hand, as illustrated in FIG. 5, the internal electrodes 27*a* and 27*b* and the strip-like internal electrode 31 are printed on a green sheet of the same piezoelectric-ceramics. A plurality of similar green sheets with the same electrode patterns are prepared. Subsequently, the plurality of those green sheets illustrated in (a) and (b) are alternately stacked and a ceramics green sheet having no electrode patterns is stacked thereon to form a stacked body. Moreover, the stacked body is thermocompression-bonded and sintered in air to form a sintered body. Next, the side electrodes 28*a* to 29*b* and the end electrodes 32*a* and 32*b* are formed on the both sides and the both end surfaces of the sintered body, respectively, by the use of silver-palladium paste. Thereafter, polarization is carried out in the above-mentioned manner so that the piezoelectric transformer of FIG. 4 is obtained.

A piezoelectric transformer element according to this embodiment was manufactured. The sintering condition was at 1100° C. for two hours. The polarization condition was in silicon oil kept at 150° C. under the electric field strength of 1 kV/mm for fifteen minutes. In order to evaluate the characteristics, the piezo-electric transformer thus obtained was driven by applying a sine wave input voltage thereto using as a load a cold-cathode tube having a diameter of 2.2 mm and a length of 220 mm. In this state, the step-up characteristic and the relationship between the vibration rate and the heat generation during stable lighting were measured. Table 2 shows the result of measurement.

For the purpose of comparison, the Lozen type piezoelectric transformer of the conventional structure having the same size and the same number of layers was manufactured under the similar sintering and polarization conditions and subjected to the same evaluation test. The result is shown in the same Table 2.

TABLE 2

|  | Lozen type | Embodiment |
| --- | --- | --- |
| dimension (mm) | 42 × 12 × 1.5 | 42 × 6 × 1.5 |
| number of layers | 10 | 10 |
| input voltage (Vpp) | 18 | 24 |
| tube current (mA) | 5 | 5 |
| step-up ratio | 50 | 45 |
| vibration rate (m/s) | 0.38 | 0.20 |
| heat generation ΔT (° C.) | 65 | 15 |
| efficiency (%) | 80 | 84 |

Referring to Table 2, in the conventional piezoelectric transformer, the vibration rate is 0.38 m/s and the heat generation is as high as 65° C. However, in the piezoelectric transformer of this invention, the vibration rate and the heat generation quantity ΔT are low for the same output (tube current) so that the efficiency is more excellent, although the step-up ratio is equal to 45 and slightly low.

In the above-mentioned embodiment, the input electrodes are formed as the stacked type using the internal electrodes alone. In addition, the surface electrodes may be formed on the upper and the lower surfaces of the rectangular plate in the second and the third regions A2 and A3. Alternatively, only surface electrodes alone on the upper and the lower surfaces may be used without providing the internal electrodes.

Figure 6:
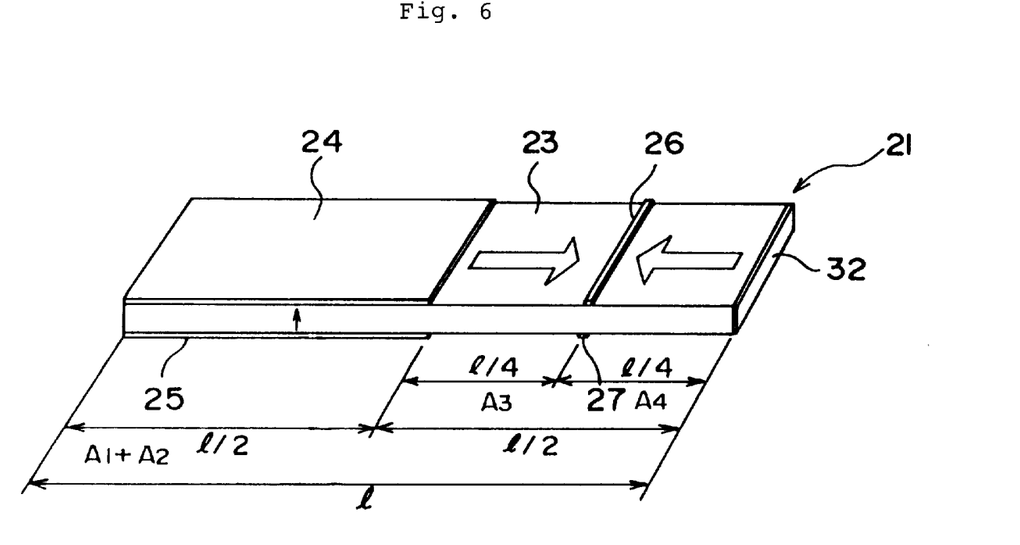
FIG. 6 is a schematic perspective view illustrating a single-plate type piezoelectric transformer according to another embodiment of this invention.

Referring to FIG. 6, description will be made as regards still another embodiment of this invention.

Referring to the figure, a piezoelectric transformer of this embodiment is similar to the single plate type in the conventional Lozen type piezoelectric transformers described in conjunction with FIG. 1. The differences therebetween reside in that the output electrodes comprise the strip-like electrodes 26 and 27 similar to those in the embodiment of FIG. 3, and that the output electrodes are formed at positions at the boundary between the third region A3 and the fourth region A4. The end electrode is formed over the end surface of the fourth region A4 as a ground (earth) electrode for output. Polarization directions in the third and the fourth regions A3 and A4 are opposite to each other in the longitudinal direction.

Polarization and the manufacturing method are similar to those of the embodiment in FIG. 3 except that the number of the input electrodes and the positions of the electrodes are different. Therefore, the detailed description is omitted herein.

Description will now be made as regards an operation.

One of surface electrodes 24 and 25 as the input electrodes and an end electrode 32 are grounded. Although not shown in the figure, the input voltage is applied between the input electrodes 24 and 25 through the input terminals (28, 29 in FIG. 3) connected the input electrodes 24 and 25, like in FIG. 3, or through the side electrode (18 in FIG. 1) formed on the side surface, like in FIG. 1. The input voltage is an AC voltage having a frequency such that one wavelength corresponds to the length (l) of the rectangular plate 23. Consequently, the rectangular plate vibrates with the displacement distribution and the stress distribution illustrated in FIGS. 2(a) and (b), respectively, due to the piezoelectric effect, like the conventional Lozen type piezoelectric transformer. As a result of the vibration, the output voltage is produced at the output electrodes 26 and 27 by the piezoelectric effect. The output voltage is obtained as a voltage between at least one of the output electrodes 26 and 27 and the input electrode 24 or 25 which is grounded. Alternatively, the output voltage is extracted as a voltage between at least one of the output electrodes 26 and 27 and the end electrode 32 (grounded).

A piezoelectric transformer element according to this embodiment was manufactured. The polarization condition was in silicon oil kept at 140° C. under the electric field strength of 1 kV/mm for fifteen minutes. In order to evaluate the characteristics, the piezoelectric transformer thus obtained was subjected to the evalution test similar to that described in conjunction with the embodiment of FIG. 3. Table 3 shows the result.

For the purpose of comparison, the single-plate Lozen type piezoelectric transformer of the conventional type structure having the same size was manufactured under the similar polarization conditions and subjected to the same evalution test. The result is shown in the same Table 3.

As apparent from Table 3, the piezoelectric transformer of this embodiment is not inferior in step-up ratio, although the volume is half, as compared with the conventional Lozen type piezoelectric transformer. The vibration rate is low for the same output (tube current) so that the heat generation quantity is small.

Consequently, this embodiment is excellent as the piezoelectric transformer which has a small size and a high output.

TABLE 3

|  | Lozen type | Embodiment |
| --- | --- | --- |
| device dimension (mm) | 42 × 12 × 1.5 | 42 × 6 × 1.5 |
| input voltage (Vpp) | 95 | 120 |
| tube current (mA) | 5 | 5 |
| step-up ratio | 5 | 4 |
| vibration rate (m/s) | 0.4 | 0.2 |
| heat generation ΔT (° C.) | 65 | 15 |
| efficiency (%) | 80 | 84 |

In this embodiment, description and illustration have been directed to the single plate type structure with the input electrodes comprising the surface electrodes 24 and 25 alone. However, the input electrodes can be formed as the stacked type structure including the internal electrodes and the surface electrodes, as illustrated in the prior art of FIG. 1. Furthermore, use may be made of the stacked type structure in which the input electrodes comprise the internal electrodes alone without any surface electrodes. By the use of the stacked type structure, it is possible to increase the step-up ratio.

As described above, when the piezoelectric transformer of the embodiment in FIG. 6 is used, one of the input electrodes and the end electrode are grounded. The purpose is to obtain a high output voltage. This also applies to the stacked structure comprising the internal electrodes as the input electrodes.

Figure 7:
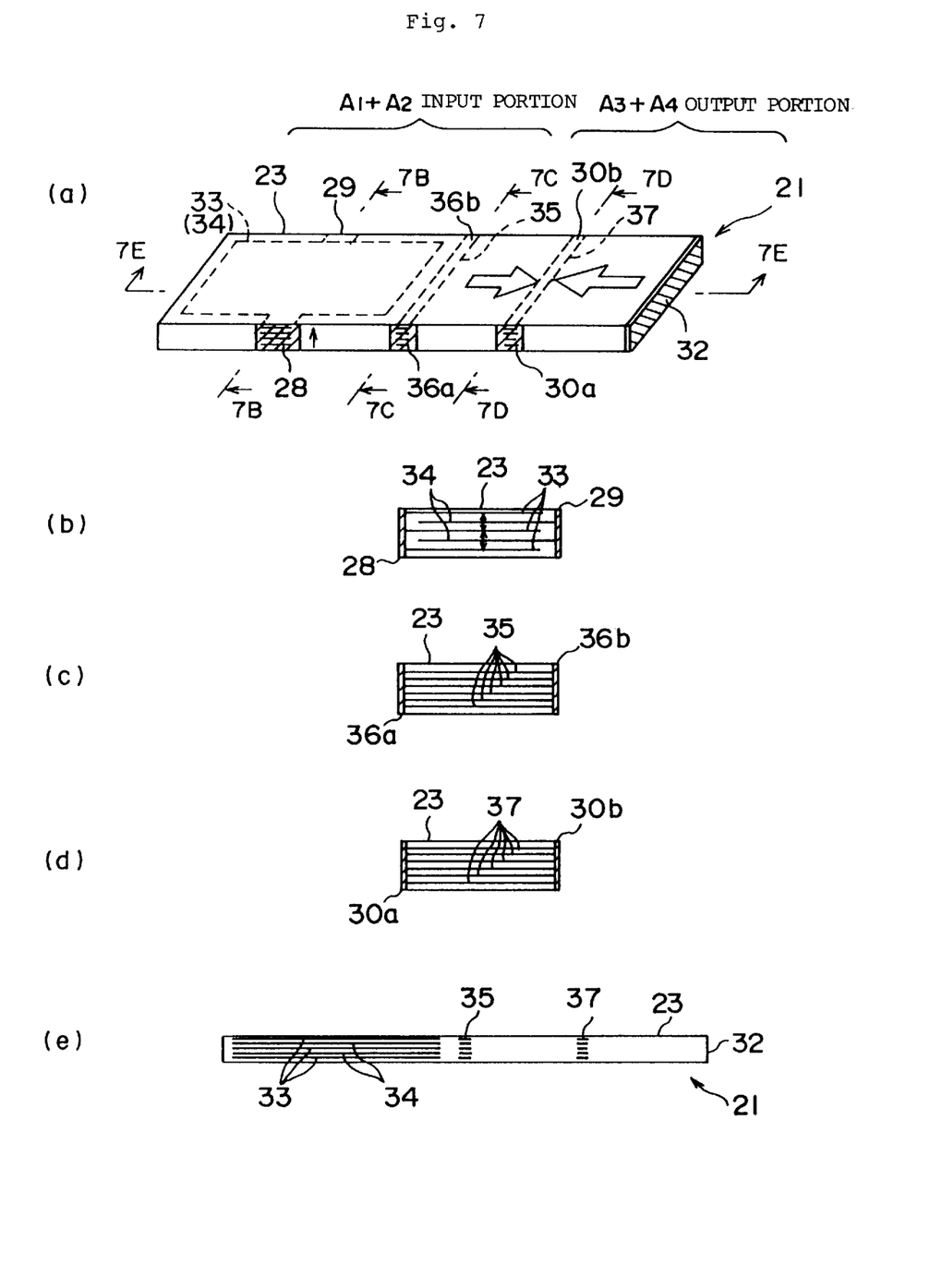
FIG. 7 shows views illustrating a stacked-type piezoelectric transformer according to another embodiment of this invention, (a) being a schematic perspective view thereof, (b), (c), (d), and (e) being sectional views taken along a line 7B—7B, a line 7C—7C, a line 7D—7D, and a line 7E—7E in (a), respectively.

In the meanwhile, instead of grounding one of the input electrodes, a ground electrode may be formed in the vicinity of the input electrodes, that is, in the vicinity of the boundary between the second region A2 and the third region A3 to be adjacent to the input electrodes. FIG. 7 shows an embodiment having the above-mentioned structure.

Referring to FIGS. 7(a), (b), and (e), in the piezoelectric transformer of this embodiment, the input electrodes comprise the internal electrodes 33 and 34 and the side electrodes 28 and 29, like the input electrodes illustrated in the embodiment of FIG. 1. However, the surface electrodes (24, 25) are not used. Of course, the surface electrodes can be used.

Referring to FIGS. 7(a), (c), and (e), the ground electrode formed in the vicinity of the input electrodes comprises a plurality of strip-like internal electrodes 35 arranged at that position inside the piezoelectric plate at intervals in the thickness direction and extending in the width direction, and side electrodes 36a and 36b. Strip-like surface electrodes may be formed on the surface of the rectangular plate at positions corresponding to the strip-like internal electrodes 35. The surface electrodes alone may be used without using any strip-like internal electrodes.

Referring to FIGS. 7(a), (d), and (e), the output electrodes comprise strip-like internal electrodes 37 formed at the boundary between the third and the fourth regions A3 and A4 and the side electrodes 30a and 30b at the both sides thereof. The strip-like surface electrodes 26 and 27 illustrated in FIG. 6 may be additionally formed. Alternatively, the strip-like surface electrodes alone may be formed.

The operation of the piezoelectric transformer of this embodiment is similar to that of the embodiment in FIG. 6. However, it is not necessary to ground the input electrodes upon use. Instead, the ground electrodes 35 are grounded through the side electrodes 36a and 36b.

Figure 8:
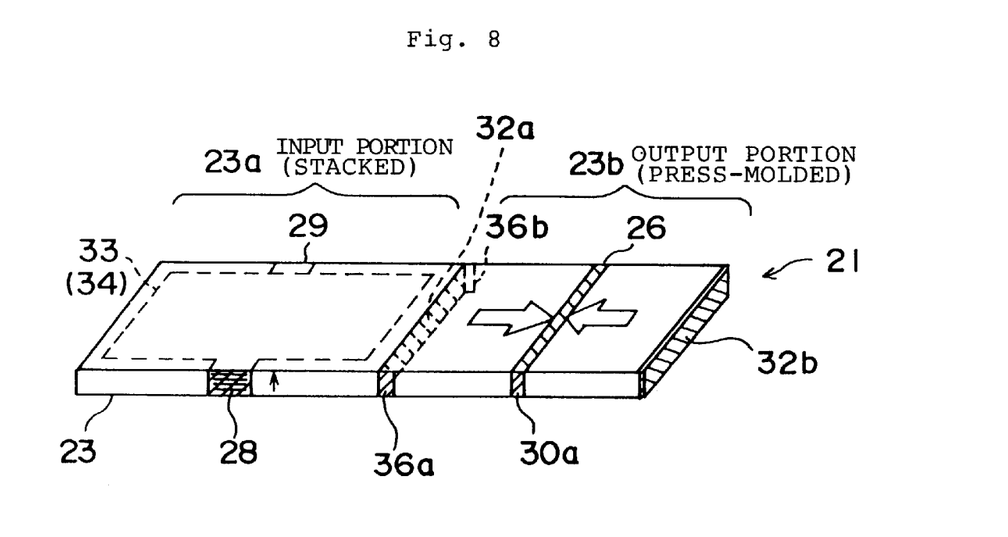
FIG. 8 is a schematic perspective view illustrating a stacked-type piezoelectric transformer according to still another embodiment of this invention.

FIG. 8 is a perspective view of yet another embodiment. The piezoelectric transformer of this embodiment is similar in basic structure to the embodiment of FIG. 7 but has a structure in which an input portion 23a comprising the first and the second regions A1 and A2 and an output portion 23b comprising the second and the third regions A3 and A4 are formed by different rectangular plates which are bonded to each other.

The input portion 23a is formed as a stacked type and comprises as the input electrodes a plurality of the internal electrodes 33 and 34 similar to the input electrodes of the embodiment of FIG. 7, and the side electrodes 28 and 29 as the input terminals. The input electrodes may comprise the surface electrodes or may be formed by the surface electrodes alone without using any internal electrodes.

The output portion 23b comprises a press-molded piezoelectric plate with the end electrodes 32a and 32b as the ground electrodes formed at both longitudinal end surfaces and the strip-like surface electrodes 26 and 27 formed on the opposite surfaces at the longitudinal center to extend in the width direction. On both side surfaces of the output portion 23b, the side electrodes 30a and 30b (30b alone being illustrated) are formed and connected to both ends of the strip-like surface electrodes 26 and 27. As a whole, an endless strip-like electrode is formed as an output electrode.

The input portion 23a and the output portion 23b are combined by adhering their end surfaces with an adhesive to form the piezoelectric transformer comprising a single piezoelectric rectangular plate. In order to externally lead out the grounding end electrode 32a arranged between the adhered surfaces of the input portion 23a and the output portion 23b, side electrodes 36a and 36b connected to the grounding end electrode 32a are formed on the side surfaces of the output portion 23b. Consequently, the end electrode 32a corresponds to the ground electrode 35 of FIG. 7.

Since the operation of the above-mentioned piezoelectric transformer is basically similar to that of the piezoelectric transformer of FIG. 7, description of the operation is omitted here.

Like in the embodiment of FIG. 5, the stacked type piezoelectric transformer illustrated in FIG. 7 was manufactured by printing of the electrodes on green sheets, stacking, and sintering followed by formation of the side electrodes and the end electrodes on the external surfaces of the sintered body and polarization under the various conditions shown in Table 4. The dimension of the piezoelectric transformer thus manufactured is 42 mm×6 mm×2 mm.

On the other hand, the piezoelectric transformer of FIG. 8 having the same dimension (42 mm×6 mm×2 mm) was manufactured in the manner described in the following.

The input portion 23a having the dimension of 21×6×2 mm$^3$ was manufactured as a stacked body. Specifically, the green sheets of piezoelectric ceramics having high Qm were formed with internal electrode patterns printed thereon, stacked into a ten layer structure, and then cut into pieces of a predetermined size. After dewaxing, each stacked body was sintered at 1100° C. for two hours. Side electrodes 23 for input were printed on the outer side surfaces of the sintered body thus obtained to form the input portion 23a of the piezoelectric transformer.

On the other hand, two kinds of the output portions 23b were manufactured, that is, a press-molded body and a hot isostatic pressed (HIP) body. Specifically, piezoelectric-ceramics powder having a composition similar to that used for the input portion 23 was subjected to dry press to obtain the press-molded body. The press-molded body thus obtained was sintered at 1200° C. to obtain the sintered body. Some of the sintered bodies thus obtained were worked into the dimension of 21×6×2 mm$^3$ similar to that of the input portion 23a. Thereafter, the grounding end electrode and the endless strip-like output electrode were formed on the external surface thereof to obtain the output portion 23b as a pressed body. Moreover, the remaining ones of the above-mentioned sintered bodies were subjected to hot isostatic pressing to obtain HIP molded bodies improved in magnetic characteristics. The HIP molded bodies were worked into the dimension of 21×6×2 mm$^3$ equal to that of the input portion 23a. Thereafter, the grounding end electrode and the endless strip-like output electrodes were formed in the similar manner on the external surface thereof to obtain the output portion 23a as HIP bodies.

A plurality of the input portions 23a of the stacked type preliminarily obtained were adhered by an adhesive to the pressed bodies and the HIP bodies as the output portions 23b, respectively. The adhered bodies thus obtained were polarized under the various conditions shown in Table 4 to obtain samples of the piezoelectric transformer in FIG. 8.

TABLE 4

Polarization Condition of Each Sample

| | | Embodiment of FIG. 7 | Embodiment of FIG. 8 | |
|---|---|---|---|---|
| | | I | II | III |
| ① | output side | 180° C., 0.8 kV/mm | 180° C., 0.8 kV/mm | 180° C., 0.8 kV/mm |
| | input side | 150° C., 1.5 kV/mm | 150° C., 1.5 kV/mm | 150° C., 1.5 kV/mm |
| ② | output side | 180° C., 1.0 kV/mm | 180° C., 1.0 kV/mm | 180° C., 1.0 kV/mm |
| | input side | 150° C., 1.5 kV/mm | 150° C., 1.5 kV/mm | 150° C., 1.5 kV/mm |
| ③ | output side | 180° C., 1.5 kV/mm | 180° C., 1.5 kV/mm | 180° C., 1.5 kV/mm |
| | input side | 150° C., 1.5 kV/mm | 150° C., 1.5 kV/mm | 150° C., 1.5 kV/mm |

In Table 4, the type of the embodiment of FIG. 7 is labelled I while, in the embodiment of FIG. 8, the types using the pressed body and the HIP body as the output portion 23b are labelled II and III, respectively. Three kinds of polarization conditions were applied for each type. Thus, nine kinds of samples I① to III ③ were obtained.

In Table 4, when the input-side polarization condition was kept constant and the electric field strength applied on the output side was increased, cracks were caused to occur in the vicinity of the strip-like output electrodes at the electric field strengths of 1.0 kV/mm and 1.5 kV/mm for the type I and the type II, respectively. On the other hand, in the type III, no change was observed under any of three kinds of the polarization conditions. Specifically, the integral sintered bodies in the embodiment of FIG. 7 can be applied with no more than the insufficient electric field strength because of insufficient sintering at the output side. Specifically, in the piezoelectric transformer having the structure illustrated in FIG. 7, tensile stress concentrates to the vicinity of the strip-like electrode for high voltage extraction upon polarization of the output side. Therefore, the polarization conditions must be carefully selected. In contrast, in the structure according to the embodiment of FIG. 8 in which the input portion and the output portion are individually formed as the stacked body and the press-molded or shaped body, respectively, and then adhered together, the mechanical strength as ceramics is improved because of the difference in sintering temperature of the output portion. Accordingly, the sufficient polarization is possible although the composition is identical.

For the samples I①, II②, and III ③ selected from the samples of the piezoelectric transformer obtained by polarization, one per each type, the sine wave voltage having the frequency corresponding to the wavelength equal to the length of the piezoelectric transformer was applied to the input portion of the piezoelectric transformer with use of a load of a cold-cathode tube having a diameter of 2.6 mm and a length of 220 mm and the vibrator characteristics and the step-up characteristics were measured. The results thus obtained are shown in Table 5 and Table 6.

TABLE 5

Vibrator Characteristics of Samples

| | | Sample I ① | Sample II ② | Sample III ③ |
|---|---|---|---|---|
| Cd | input side | 80 nF | 80 nF | 80 nF |
| | output side | 18 pF | 23 pF | 28 pF |
| $k_{eff}$ | input side | 22% | 22% | 22% |
| | output side | 42% | 46% | 49% |
| Qm | input side | 500 | 520 | 500 |
| | output side | 440 | 570 | 660 |

TABLE 6

Piezoelectric Transformer Characteristics

| | Sample I ① | Sample II ② | Sample III ③ |
|---|---|---|---|
| input voltage (Vpp) | 24 | 21 | 19 |
| vibration rate (m/s) | 0.3 | 0.28 | 0.26 |
| heat generation ΔT (° C.) | 10 | 7 | 4 |

It is understood from Table 5 that capacitance Cd and a coupling factor $k_{eff}$ at the output side are improved in the type II of the embodiment of FIG. 8 and further in the type III, as compared with the type I of the embodiment of FIG. 7. It is understood that, by changing the sintering conditions between the input portion and the output portion, the ceramics characteristic of the piezoelectric plate is improved to enable the sufficient polarization so that the remarkable difference is produced in vibrator constant.

Moreover, Table 6 shows the input voltage, the device temperature, and the vibration rate during stable lighting at 5 mA. As will be understood, these values are lower in both of the types II and III in the embodiment of FIG. 8 than in the type I of the embodiment of FIG. 7.

As is apparent from comparison between Table 2 and Table 6, the type I of the embodiment of FIG. 7 is improved in the vibration rate and heat generation temperature as compared with the conventional Lozen type piezoelectric transformer of the stacked type illustrated in FIG. 1.

In the above-mentioned embodiments, although the PZT ceramics plate is exemplified as the piezoelectric plate, use may be made of any other material having a piezoelectric characteristic. For example, use may be made of lithium niobate single crystal known as excellent in piezoelectric vibration characteristic. Moreover, although the silver-palladium thin film formed by printing is exemplified as the electrode, any other conductive thin film can be used.

In the foregoing, description has been made as regards the several embodiments of this invention. It will be understood here that this invention is not restricted to those embodiments and can be implemented in various other manners without the scope of this invention.

INDUSTRIAL APPLICABILITY

As described above, according to this invention, it is possible to obtain a high-efficiency piezoelectric transformer which has a low vibration rate and small heat generation for the same output power even with a half volume as compared with the conventional Lozen type piezoelectric transformer and, in particular, to provide a piezoelectric transformer adapted for use in a back-lighting power supply for a liquid-crystal display.

We claim:

1. A piezoelectric transformer utilizing vibration in a one-wavelength resonance mode in a longitudinal direction of a piezoelectric rectangular plate, comprising:

said piezoelectric rectangular plate having a plate length extending from a first end to a second end opposite thereto, a plate width, and a plate thickness, and having virtually divided quarter regions as first to fourth regions arranged along said plate length from said first end to said second end in this order;

input electrode means comprising at least two plane electrodes formed over said first and said second regions of said piezoelectric plate and which is applied with an AC input voltage having a frequency corresponding to a wavelength equal to said plate length to drive one-wavelength resonance of said piezoelectric plate; and output electrode means comprising a strip-like electrode formed at the boundary between said third and said fourth regions of said piezoelectric plate to extend in the width direction and a grounding electrode formed on an end surface at said second end for outputting an AC output voltage produced from the one-wavelength resonance of said piezoelectric plate;

said first and said second regions being polarized unidirectionally in a direction of said plate thickness while said third and said fourth regions being polarized opposite to each other in a direction of said plate length.

2. A piezoelectric transformer as claimed in claim 1, further comprising an additional grounding electrode formed at the boundary between said second and said third regions of said piezoelectric plate.

3. A piezoelectric transformer as claimed in claim 2, wherein said additional grounding electrode comprises:

a plurality of grounding strip-like electrodes being spaced from one another in said plate thickness direction; and two grounding side electrodes formed on the side surfaces confronting each other in the plate thickness direction of said piezoelectric plate and connected to both ends of said grounding strip-like electrodes, respectively, to extract said AC output voltage.

4. A piezoelectric transformer as claimed in claim 3, wherein said grounding strip-like electrodes are embedded in said piezoelectric plate as internal strip-like electrodes.

5. A piezoelectric transformer as claimed in claim 3, wherein two of said grounding strip-like electrodes are formed on the upper and the lower surfaces, respectively, while the remaining grounding strip-like electrodes are embedded in said piezoelectric plate as internal strip-like electrodes.

6. A piezoelectric transformer as claimed in claim 1, wherein a section including said first and said second regions of said piezoelectric plate which are provided with said input electrode means and another section including said third and said fourth regions of said piezoelectric plate provided with said output means are formed by separate components as an input portion and an output portion, respectively, said input and said output portions being bonded and adhered to each other.

7. A piezoelectric transformer as claimed in claim 6, wherein said input portion comprises a sintered stacked body formed by alternately stacking said plane electrodes and piezoelectric layers while said output portion comprises a shaped and sintered body of a piezoelectric material with said output electrode means formed on the surface of said body.

8. A piezoelectric transformer as claimed in claim 7, wherein said shaped and sintered body is obtained by hot-isostatic pressing.

9. A piezoelectric transformer as claimed in any one of claims 6 to 8, wherein an additional grounding electrode is interposed between the bonded surfaces of said output and said input portions.

* * * * *